Aug. 14, 1962 M. L. LINCOLN 3,049,647
ELECTRICAL CHASSIS
Filed Sept. 2, 1958
Fig. 1
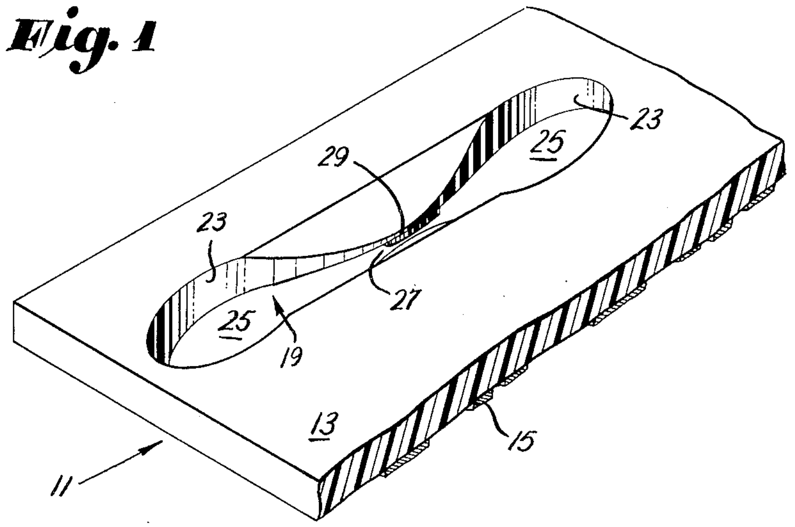
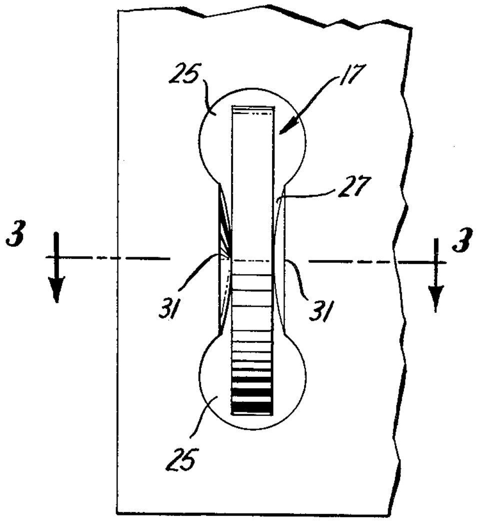
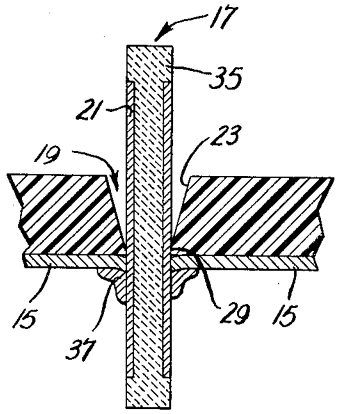
Fig. 3
Fig. 2
INVENTOR
MILAN L. LINCOLN
BY
Robert E. Strauser
ATTORNEY United States Patent Office 3,049,647
Patented Aug. 14, 1962

3,049,647

ELECTRICAL CHASSIS

Milan L. Lincoln, Batavia, N.Y., assignor, by mesne assignments, to Sylvania Electric Products Inc., Wilmington, Del., a corporation of Delaware Filed Sept. 2, 1958, Ser. No. 758,299
1 Claim. (Cl. 317—101)

This invention generally relates to electrical devices and more particularly to electrical chassis of the printed circuit board type.

The number of applications of printed circuit board chassis is ever-increasing in the electrical industry. These boards normally comprise a laminate of an insulating base material having conductors affixed thereto. Electrical components such as coils, condensers, etc. are generally physically mounted upon the insulating base side of the laminate. The board is formed to provide appropriately positioned apertures and the electrical component leads are passed through these apertures to a contact position with the conductors. A solder connection is conventionally made between the component leads and the conductor.

Many types of electrical components have been physically designed so that they are uniquely adapted for printed circuit board applications. One such component is called a "leadless" disc capacitor. The body structure of this capacitor is generally that of a conventional disc capacitor. However, instead of having lead wires extending from the body, the opposed major surfaces of the disc which serve as the capacitor plates also serve as the leads.

When a "leadless" disc capacitor is utilized in the circuit of a printed circuit board, it has been the practice to insert the disc into a straight-through rectangular slot in the board. The end walls of the slot are spaced apart a distance less than the diameter of the disc so that this capacitor may be wedged into the slot lengthwise. The conductive layers or plates disposed on the opposite flat sides of the disc extend below the bottom of the slot and are soldered to the circuit conductors.

One modification of a disc capacitor has taken the form of a trapezoid or keystone in cross section and is generally referred to as a wedge-type disc capacitor. This form of component is also wedge-fitted into a straight-through rectangular slot in the board.

It has been found that the wedge mounting of electrical components within a straight-through rectangular slot in the board has resulted in chassis assemblies having several disadvantages. One of the chief disadvantages resides in the large number of rejects occurring from fractured components. Due to the slot configuration and the component shape, a strain is developed in the component during soldering and subsequent operation in the circuit which results from expansion and contraction of the board and component. In addition, it is very difficult to assure adequate solder contact between the component plates and the circuit board conductor on a production line basis. Since the slot walls in the board are straight-through and vary in spatial distance from one another within specified tolerances, and since the component widths also vary, a gap between the circuit board conductor and component conductive layers often occurs. A large number of open circuit rejects are produced due to the difficulty encountered in bridging this gap with solder.

Accordingly, an object of the invention is to reduce the aforementioned disadvantages and to improve the fabrication of printed circuit board types of electrical chassis.

A further object is to reduce the number of fractured electrical components normally encountered in a printed circuit board chassis.

A still further object is to insure the completion of an excellent electrical contact between the electrical component and the chassis conductors.

The foregoing objects are achieved in one aspect of the invention by the provision of a laminated electrical chassis panel comprising an insulator having an electrical conductor affixed thereto. The panel is formed with internal walls defining a slot having a relatively narrow neck portion and a relatively small wall thickness at the neck portion. The electrical component is wedged into the slot to a position where electrical contact is made with the panel conductor.

For a better understanding of the invention, reference is made to the following description taken in conjunction with the accompanying drawings in which:

FIG. 1 is a perspective view illustrating a portion of a printed circuit board;

FIG. 2 is a top view of the panel shown in FIG. 1 with an electrical component mounted thereon; and FIG. 3 is a cross sectional view taken along line 3—3 of FIG. 2 illustrating particularly the manner in which the electrical component is mounted upon the printed circuit board.

Referring to the drawings, a laminated electrical chassis panel 11 is shown comprising an insulating base 13 having discrete conductors 15 affixed thereto. Although single base and conductor layers are illustrated, a chassis employing a plurality of superposed insulating and conductive strips can be used if desired. Base 13 may be formed from a conventional insulating material such as a paper filled phenolic. The thickness of the base is considerably greater than that of conductor 15. For instance, the conductor, which is shown as a copper foil, may have a thickness of approximately .001 inch whereas the thickness of the phenolic may be about .0625 inch.

Panel 11 is used as a chassis frame upon which the electrical components are mounted. For purposes of simplicity, only a small part of the panel has been shown. This panel normally supports coils, condensers, tube sockets, etc. Certain types of components (not shown) are mounted upon insulating base 13 and have their wire leads extending through the board to a contact position with one or more of the discrete conductors 15. Other types of components such as the disc capacitor 17 are wedge-mounted within appropriately formed slots 19 provided in the panel. The conductive layers or condenser plates 21 formed on opposite sides of disc 17 serve as electrical leads and are positioned, after assembly, to contact conductor 15. FIG. 3.

It can be seen from the drawings that internal walls 23 define the substantially hour-glass shaped slot 19. The opposed end portions 25 of the slot are connected by a relatively narrow neck portion 27. Side walls 23 are located on either side of the neck portion and are tapered toward conductor 15 to form terminal wall sections 29. The conductor which is associated with component 17 is located directly beneath terminal section 29 and extends to the edge thereof. It can be seen therefor, that the thickness of panel 15 is largest at end portion 25 and thinnest at neck portion 27. Also, the slot 19 is wider at the end portions than at the neck or central portion.

In fabricating slot 19 in the panel, a male die member having a cross-sectional profile of the slot may be forced through the panel from the conductor side. Supporting the panel on the opposite side may be a die member having an opening conforming to the profile of end portions 25 connected by surfaces lying along lines 31. Accordingly, as the male die member blanks out the slot, the curvature of the end portions are accurately formed as shown. However, the central or neck portion 27, which is not supported inwardly of line 31, breaks away to form the tapered walls.

The width and length of slot 19 is pre-selected in accordance with the general type and size of component which will be inserted therein. The slot length is made larger than the largest component and of smaller width than the narrowest component. For instance, the disc capacitor 17 may have a width of .034 inch. In this event, the slot may be formed to provide a width of .023 inch.

The enlarged end portions 25 of slot 19 serve several purposes. They provide strain relief for the panel in addition to allowing clearance for the edges of component 17. Although these slot end portions are shown as having a substantially circular shape, it is to be understood that other shapes may be used so long as they do not bind component 17 or do not provide insufficient strain relief. For instance, these end portions may be made in the form of a rectangle having larger lengthwise dimensions than the component.

Leadless circular disc capacitor 17, which comprises a dielectric body 35 between conductive layers or plates 21, has been shown for purposes of illustration. However, it is to be understood that other types of electrical components are considered to be within the scope of this invention. For instance a wedge, oval, rectangular, etc. shaped component of the lead or leadless type could also be utilized with a modification of slot 19 in accordance with the concept described herein.

Unique component mounting means and circuit connections are provided by panel 11. During the component assembly operation, capacitor 17 is inserted into the panel slot from a direction opposite conductor 15 until it reaches a position where the conductors press against plates 21. Since the width of slot 19 at neck portion 27 is initially smaller than the width of capacitor 17, a wedge-mounting of the capacitor is achieved by virtue of the compressive force extended on side walls 23 of terminal section 29. Also, since the conductors 15 initially extend to walls 23, the insertion movement of capacitor 17 forces plates 21 into frictional engagement with the conductors to cause slight curling thereof away from insulating base 13, FIG. 3. An excellent electrical connection is thereby achieved. It may be desirable, although not necessary, to provide a solder joint 37 between conductor 15 and plates 21.

The relatively narrow thickness of terminal wall sections 29 allows an over-sized electrical somponent to be mounted within the slot without breaking base 13 and without causing a strain in the component which is sufficient to cause fracture.

The conductors on the printed circuit board panel described herein may be formed in any conventional manner such as by printing and etching, plating, stamping or conductive ink rolling over a molded base.

The panel and chassis described herein provides many advantages over prior devices. For example, the component wedge-type mounting locks the part in position for subsequent assembly operations, it automatically places the conductor path adjacent the component plates, and it produces excellent electrical contact and permits sufficient exposed plate area for soldering. In addition, the taper in the slot and the terminal wall section spacing and thickness reduces component fractures due to thermal shock, and facilitates the use of components with a wide range of widths. The slot configuration allows utilization of components having a wide range of length dimensions as well as various cross-sectional configurations like the commercially available round, rectangular, oval, keystone, etc. shaped components. Also, insertion of the components in the panel is simplified since component orientation is not critical and since the tapered walls serve to guide the components into position.

Although several embodiments of this invention have been shown and described, it will be apparent to those skilled in the art that various changes and modification may be made therein without departing from the scope of the invention.

What is claimed is:

An electrical chassis comprising an insulating base of a given thickness having opposed major surface, an electrical conductor affixed to at least one of said major surfaces, said base having internal walls defining a slot formed to provide opposed relatively wide end portions interconnected by a curvilinear relatively narrow neck portion, the walls on opposite sides of said neck portion tapering toward the conductor affixed major surface to provide terminal sections of smaller thickness than said given thickness, said conductor being affixed to said base and extending to said internal wall at the narrowest part of the curvilinear neck portion and at the smallest terminal section thickness, in combination with an electrical component disposed within said slot and wedge fastened between said terminal wall sections, the component having a body with oppositely disposed layers of conductive material to provide leads for said component, said leads being positioned to press against said conductor and curve away from said insulating base, and a solder connection between the conductor and said leads.

References Cited in the file of this patent

UNITED STATES PATENTS

| | | |
|---|---|---|
| 2,433,384 | McLarn | Dec. 30, 1947 |
| 2,502,291 | Taylor | Mar. 28, 1950 |
| 2,542,651 | Franklin | Feb. 20, 1951 |
| 2,777,039 | Thias | Jan. 8, 1957 |
| 2,825,036 | Sorensen | Feb. 25, 1958 |
| 2,869,041 | De Cola | Jan. 13, 1959 |
| 2,876,402 | Billings | Mar. 3, 1959 |
| 2,905,744 | Rayburn | Sept. 22, 1959 |
| 2,926,340 | Blain | Feb. 23, 1960 |
| 2,990,498 | Evans | June 27, 1961 |